(12) United States Patent
Hong et al.

(10) Patent No.: US 11,521,902 B2
(45) Date of Patent: Dec. 6, 2022

(54) VERTICAL FIELD-EFFECT TRANSISTOR (VFET) DEVICES AND METHODS OF FORMING THE SAME

(71) Applicant: Samsung Electronics Co., Ltd., Suwon-si (KR)

(72) Inventors: Sa Hwan Hong, Yongin-si (KR); Yong Hee Park, Hwaseong-si (KR); Kang Ill Seo, Chungcheongbuk-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 125 days.

(21) Appl. No.: 17/032,085

(22) Filed: Sep. 25, 2020

(65) Prior Publication Data

US 2021/0013112 A1    Jan. 14, 2021

Related U.S. Application Data

(63) Continuation of application No. 16/434,211, filed on Jun. 7, 2019, now Pat. No. 10,818,560.

(60) Provisional application No. 62/698,568, filed on Jul. 16, 2018.

(51) Int. Cl.
   *H01L 29/66* (2006.01)
   *H01L 21/8238* (2006.01)
   *H01L 21/308* (2006.01)

(52) U.S. Cl.
   CPC .... *H01L 21/823885* (2013.01); *H01L 21/308* (2013.01); *H01L 21/823807* (2013.01); *H01L 21/823814* (2013.01); *H01L 29/66666* (2013.01)

(58) Field of Classification Search
   None
   See application file for complete search history.

(56) References Cited

U.S. PATENT DOCUMENTS

| | | | |
|---|---|---|---|
| 9,536,793 B1 * | 1/2017 | Zhang | H01L 21/823864 |
| 9,748,380 B1 | 8/2017 | Lie et al. | |
| 9,761,727 B2 | 9/2017 | Mallela et al. | |
| 9,805,935 B2 | 10/2017 | Anderson et al. | |
| 9,812,567 B1 | 11/2017 | Basker et al. | |
| 9,893,169 B1 | 2/2018 | Cheng et al. | |

(Continued)

OTHER PUBLICATIONS

Cheng et al. "Effective surface treatments for selective epitaxial SiGe growth in locally strained pMOSFETs" Semiconductor Science and Technology, 22(1): S140-S143 (2007).

*Primary Examiner* — Bradley Smith
(74) *Attorney, Agent, or Firm* — Myers Bigel, P.A.

(57) ABSTRACT

Vertical field-effect transistor (VFET) devices and methods of forming the devices are provided. The methods may include forming a channel region including a first channel region and a second channel region, forming a first cavity in the substrate, forming a first bottom source/drain in the first cavity, forming a second cavity in the substrate, and forming a second bottom source/drain in the second cavity. The first cavity may expose a lower surface of the first channel region, and the second cavity may expose a lower surface of the second channel region. The method may also include after forming the first bottom source/drain and the second bottom source/drain, removing a portion of the channel region between the first channel region and the second channel region to separate the first channel region from the second channel region.

20 Claims, 35 Drawing Sheets

(56) References Cited

U.S. PATENT DOCUMENTS

| | | |
|---|---|---|
| 9,935,018 B1 | 4/2018 | Xie et al. |
| 10,002,795 B1 | 6/2018 | Bi et al. |
| 10,283,621 B2 | 5/2019 | Xie et al. |
| 11,239,342 B2 * | 2/2022 | Cheng ............... H01L 29/66666 |
| 2017/0229558 A1 | 8/2017 | Anderson et al. |
| 2017/0271510 A1 | 9/2017 | Wang et al. |
| 2017/0358660 A1 | 12/2017 | Cheng et al. |
| 2018/0006151 A1 | 1/2018 | Bergendahl et al. |
| 2018/0174969 A1 | 6/2018 | Leobandung |

* cited by examiner

VERTICAL FIELD-EFFECT TRANSISTOR (VFET) DEVICES AND METHODS OF FORMING THE SAME

CROSS-REFERENCE TO RELATED APPLICATION

This application is a continuation of U.S. patent application Ser. No. 16/434,211, filed Jun. 7, 2019, which claims priority to U.S. Provisional Application No. 62/698,568, entitled VTFET (CMOS) BOTTOM S/D FORMATION METHOD WITH INDEPENDENT CONTROL OF CHANNEL TO S/D PROXIMITY BETWEEN NMOS AND PMOS, filed in the USPTO on Jul. 16, 2018, the disclosures of which are hereby incorporated by reference herein in their entirety.

FIELD

The present disclosure generally relates to the field of electronics and, more particularly, to vertical field-effect transistor (VFET) devices.

BACKGROUND

Various structures and manufacturing processes of vertical field-effect transistor (VFET) devices have been researched because of high scalability of VFET devices. Specifically, structures and manufacturing processes that allow controlling bottom source/drain side junction overlap and forming an abrupt junction near a bottom source/drain have been researched to improve performance of VFET devices.

SUMMARY

According to some embodiments of the inventive concept, methods of forming a vertical field-effect transistor (VFET) device may include forming a channel region that protrudes from an upper surface of a substrate and extends longitudinally in a first horizontal direction. The channel region may include a first channel region and a second channel region, which are aligned in the first horizontal direction, and the first channel region and the second channel region may overlap a first portion and a second portion of the substrate, respectively. The methods may also include forming a first cavity in the substrate by removing the first portion of the substrate, forming a first bottom source/drain in the first cavity of the substrate, forming a second cavity in the substrate by removing the second portion of the substrate, and forming a second bottom source/drain in the second cavity of the substrate. The first cavity may expose a lower surface of the first channel region, and the second cavity may expose a lower surface of the second channel region. The methods may further include after forming the first bottom source/drain and the second bottom source/drain, removing a portion of the channel region between the first channel region and the second channel region to separate the first channel region from the second channel region, and forming a first gate structure on a side of the first channel region and forming a second gate structure on a side of the second channel region.

According to some embodiments of the inventive concept, methods of forming a vertical field-effect transistor (VFET) device may include forming a channel region on a substrate. The channel region may extend longitudinally in a first horizontal direction and may include a first channel region and a second channel region, which are aligned in the first horizontal direction. The methods may also include forming a first bottom source/drain in the substrate, forming a second bottom source/drain in the substrate, after forming the first bottom source/drain and the second bottom source/drain, removing a portion of the channel region between the first channel region and the second channel region to separate the first channel region from the second channel region, and forming a first gate structure on a side of the first channel region and a second gate structure on a side of the second channel region. The first channel region may overlap the first bottom source/drain, and the second channel region may overlap the second bottom source/drain.

According to some embodiments of the inventive concept, methods of forming a vertical field-effect transistor (VFET) device may include forming an N-type field-effect transistor on a substrate and forming a P-type field-effect transistor on the substrate. The N-type field-effect transistor may include a first channel region, a first bottom source/drain between the first channel region and the substrate, a first gate structure on a side of the first channel region. The first channel region may include a lower surface facing the substrate, and the first bottom source/drain may separates an entirety of the lower surface of the first channel region from the substrate in a vertical direction that is perpendicular to an upper surface of the substrate. The P-type field-effect transistor may include a second channel region, a second bottom source/drain between the second channel region and the substrate, a second gate structure on a side of the second channel region. The second channel region may include a lower surface facing the substrate, and the second bottom source/drain may separates an entirety of the lower surface of the second channel region from the substrate in the vertical direction.

BRIEF DESCRIPTION OF THE DRAWINGS

FIGS. 1, 2, 3, 6, 9, and 12 are perspective views, each of FIGS. 4A, 5A, 7A, 8A, 10A, 11A, 13A, 14A, and 15A is a cross-sectional view taken along the line I-I' of its corresponding perspective view, each of FIGS. 4B, 5B, 7B, 8B, 10B, 11B, 13B, 14B, and 15B is a cross-sectional view taken along the line II-II' of its corresponding perspective view, and each of FIGS. 4C, 5C, 7C, 8C, 10C, 11C, 13C, 14C, and 15C is a cross-sectional view taken along the line III-III' of its corresponding perspective view.

DETAILED DESCRIPTION

Figure 1:
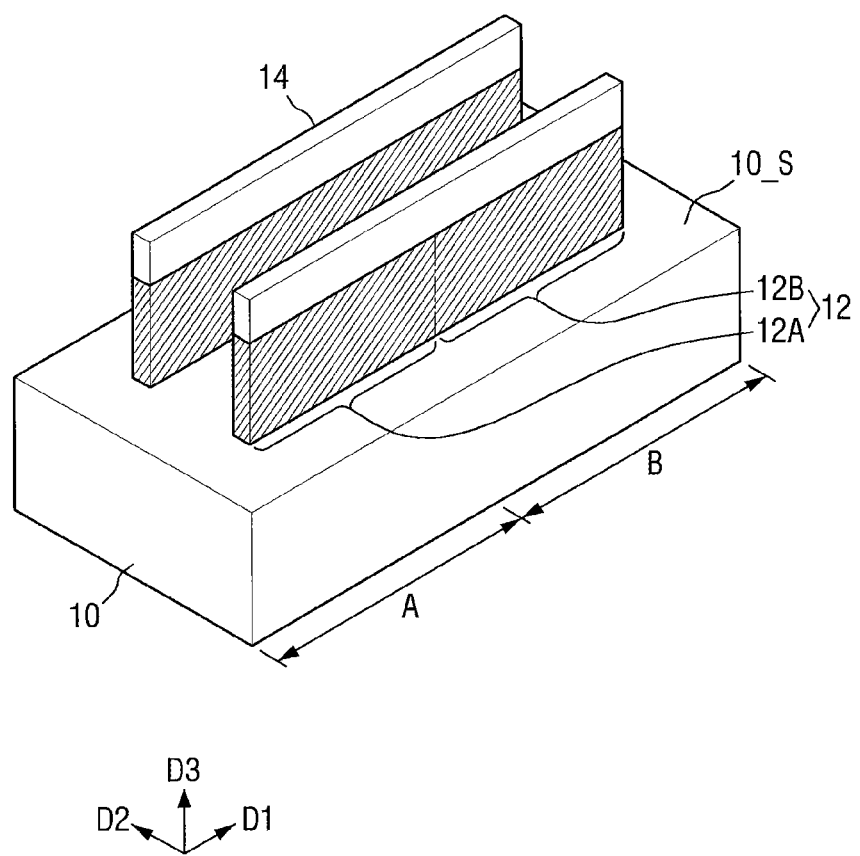
FIGS. 1 through 15C are views illustrating methods of forming a vertical field-effect transistor (VFET) device according to some embodiments of the present inventive concept.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete and will convey the scope of the disclosure to those skilled in the art. In the drawings, the sizes and relative sizes of layers and regions may be exaggerated for clarity. Like reference numbers refer to like elements throughout.

Example embodiments of the present inventive concept are described herein with reference to cross-sectional views or plan views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing.

FIGS. 1 through 15C are views illustrating methods of forming a VEFT device according to some embodiments of the present inventive concept. Specifically, FIGS. 1, 2, 3, 6, 9, and 12 are perspective views, each of FIGS. 4A, 5A, 7A, 8A, 10A, 11A, and 13A is a cross-sectional view taken along the line I-I' of its corresponding perspective view, each of FIGS. 4B, 5B, 7B, 8B, 10B, 11B, and 13B is a cross-sectional view taken along the line II-II' of its corresponding perspective view, and each of FIGS. 4C, 5C, 7C, 8C, 10C, 11C, and 13C is a cross-sectional view taken along the line III-III' of its corresponding perspective view.

Referring to FIG. 1, the methods may include forming channel regions 12 that protrude from an upper surface 10_S of a substrate 10. The substrate 10 may include a first region A and a second region B. Each of the channel regions 12 may extend longitudinally in a first direction D1 (i.e., a first horizontal direction) that is parallel to the upper surface 10_S of the substrate 10, and the channel regions 12 are spaced apart from each other in a second direction D2 (i.e., a second horizontal direction) that is parallel to the upper surface 10_S of the substrate 10. Each of the channel regions 12 may include a first channel region 12A and a second channel region 12B that are aligned in the first direction D1. The first channel region 12A may be on the first region A of the substrate 10 and may vertically overlap a portion of the substrate 10. The second channel region 12B may be on the second region B of the substrate 10 and may vertically overlap a portion of the substrate 10. In some embodiments, the first direction D1 is perpendicular to the second direction D2.

In some embodiments, forming the channel regions 12 may include forming mask layers 14 on the substrate 10 and etching the substrate 10 using the mask layers 14 as an etch mask to form the channel regions 12. Accordingly, the channel regions 12 are portions of the substrate 10. In some embodiments, as illustrated in FIG. 1, each of the mask layers 14 may have a line shape extending in the first direction D1, and thus each of the channel regions 12 may also have a line shape extending in the first direction D1. Although FIG. 1 shows two channel regions 12, it will be understood that any number (e.g., one, two, three, four, or more) of channel regions 12 can be formed on the substrate 10.

The substrate 10 may include one or more semiconductor materials, for example, Si, Ge, SiGe, GaP, GaAs, SiC, SiGeC and/or InP. In some embodiments, the substrate 10 may be a bulk substrate (e.g., a bulk silicon substrate) or a semiconductor on insulator (SOI) substrate.

Figure 2:
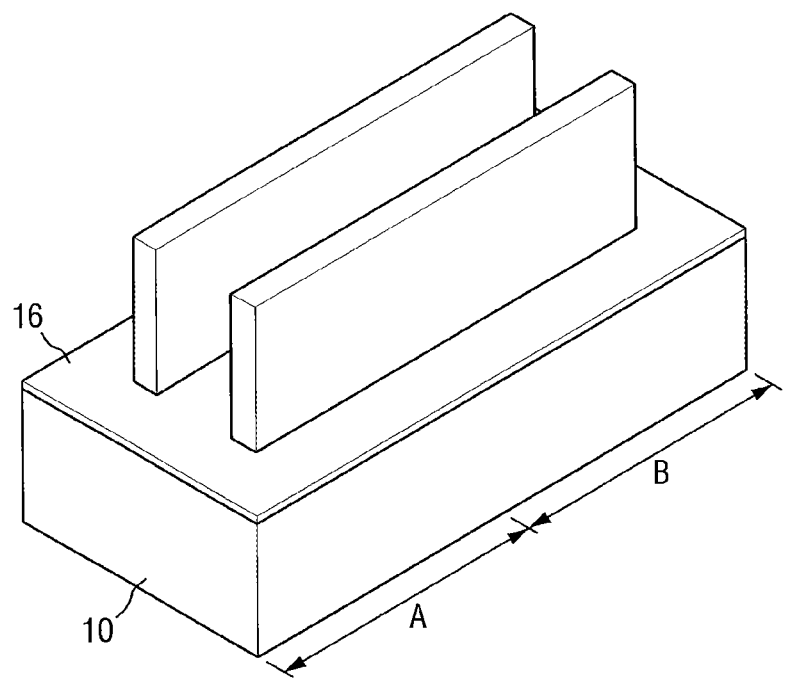

Referring to FIG. 2, a protecting layer 16 may be formed on the channel regions 12 and the substrate 10. In some embodiments, the protecting layer 16 may have a uniform thickness along a surface of the channel regions 12 and the upper surface 10_S of the substrate 10 but the inventive concept is not limited thereto. In some embodiments, the protecting layer 16 may have a first thickness on a side of the channel regions 12, which is thicker than a second thickness of the protecting layer 16 on the upper surface 10_S of the substrate 10. The protecting layer 16 may include a material different from the substrate 10 and may have an etch selectivity with respect to the substrate 10. For example, the protecting layer 16 may include a silicon nitride layer and/or silicon oxynitride layer.

Figure 3:
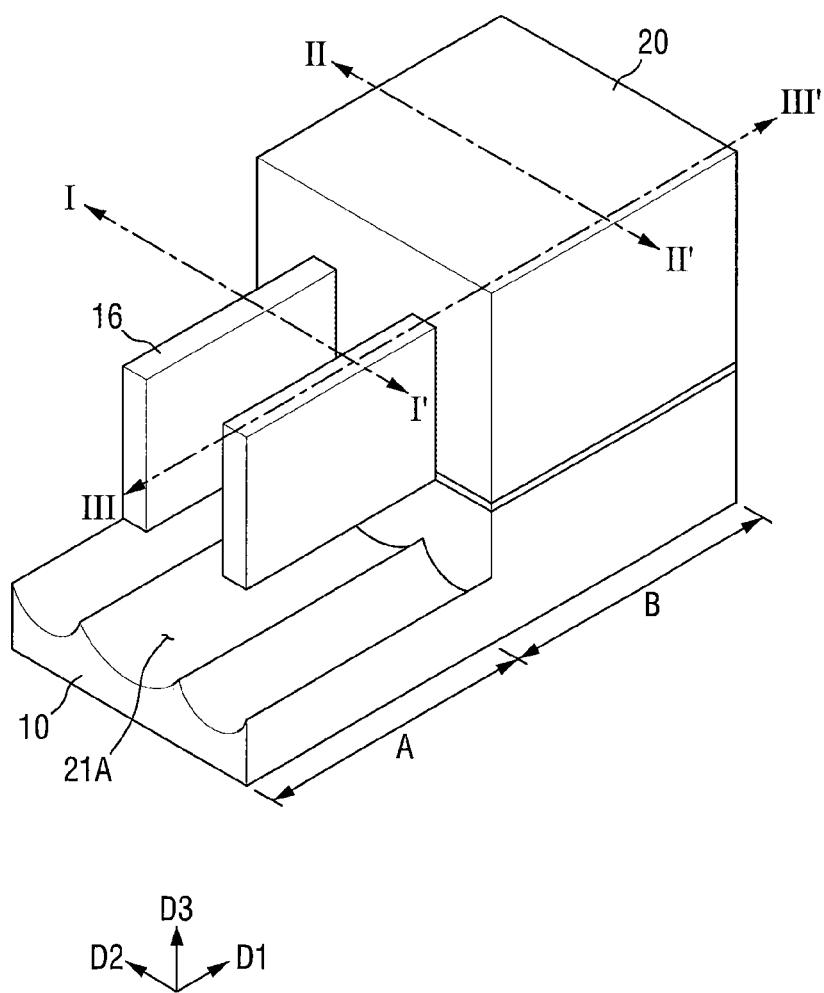

Referring to FIG. 3, a mask film 20 may be formed on the second region B of the substrate 10 and may expose the first region A of the substrate 10. A portion of the protecting layer 16 on the exposed first region A of the substrate 10 and a portion of the substrate 10 may be removed (e.g., etched) to form a first cavity 21A in the substrate 10 using the mask film 20 as a mask.

Figure 4A:
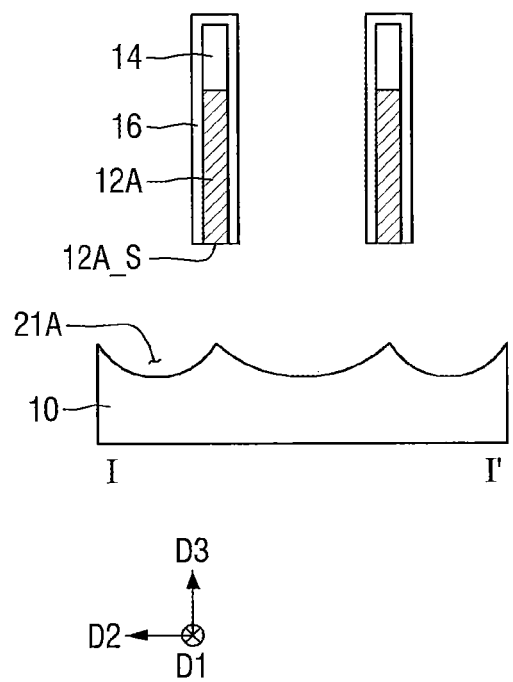
Figure 4B:
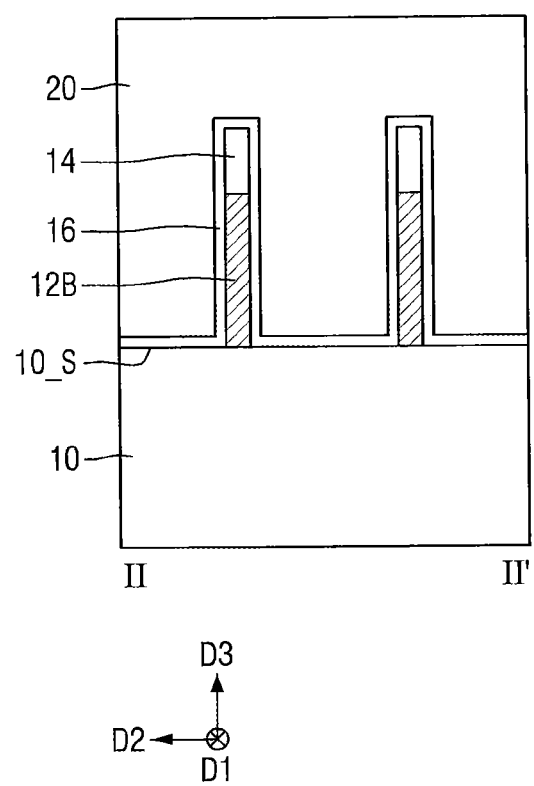
Figure 4C:
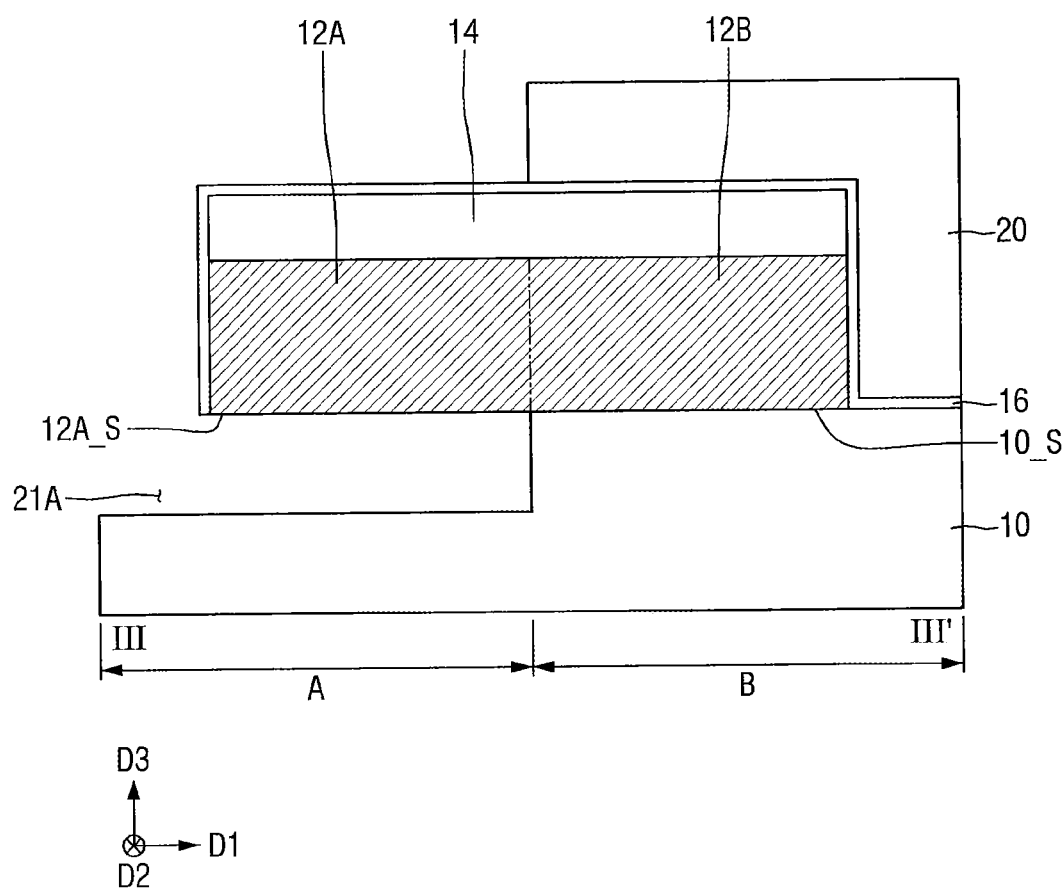

FIGS. 4A, 4B, and 4C are cross-sectional views taken, respectively, along the line I-I', the line II-II', and the line III-III' of FIG. 3, according to some embodiments of the inventive concept. The line I-I' and the line II-II' are parallel to the second direction D2, and the line III-III' is parallel to the first direction D1.

Referring to FIGS. 4A through 4C, the first cavity 21A may be formed between a lower surface 12A_S of the first channel region 12A and the substrate 10, and thus the lower surface 12A_S of the first channel region 12A may be spaced apart from the substrate 10 in a third direction D3 (e.g., a vertical direction) by the first cavity 21A. As illustrated in FIGS. 4A and 4C, the first cavity 21A may expose the lower surface 12A_S of the first channel region 12A. In some embodiments, the lower surface 12A_S of the first channel region 12A and the upper surface 10_S of the substrate 10 may be at the same level, as illustrated in FIG. 4C.

In some embodiments, the first cavity 21A may be formed in the first region A of the substrate 10 and may not extend into the second region B of the substrate 10, as illustrated in FIG. 4C. Therefore, an entirety of the lower surface 12A_S of the first channel region 12A can be exposed to the first cavity 21A without collapsing the first channel region 12A, as the first channel region 12A is connected to the second channel region 12B while forming the first cavity 21A. In other words, the first channel region 12A can be completely floating on the substrate 10 (i.e., an entirety of the lower surface 12A_S of the first channel region 12A can be spaced apart from the substrate 10 in the third direction D3) but may not collapse, as the first channel region 12A is connected to the second channel region 12B that is connected to substrate 10. In some embodiments, the protecting layer 16 may extend on the side of the channel regions 12, including both the first channel region 12A and the second channel region 12B, while forming the first cavity 21A, as illustrated in FIGS. 3 through 4C. Accordingly, the protecting layer 16 may help the first channel region 12A to be completely floating without collapsing while forming the first cavity 21A.

The mask film 20 may include a material different from the protecting layer 16 and may have an etch selectivity with respect to the protecting layer 16. The mask film 20 may be, for example, a photoresist film.

Figure 5A:
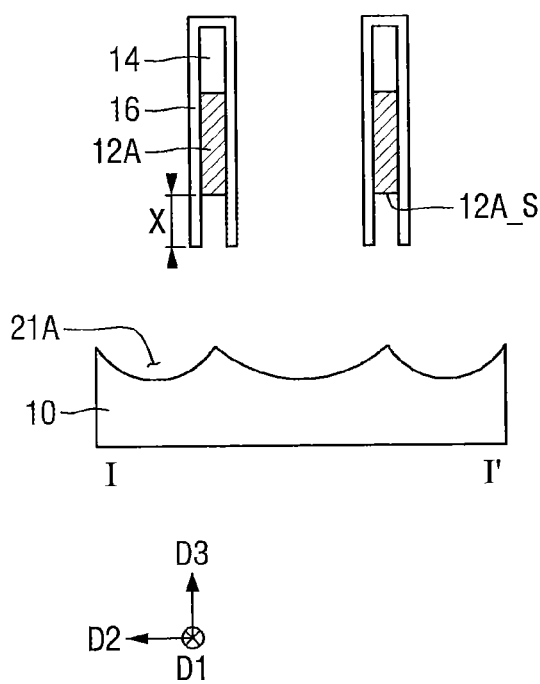
Figure 5B:
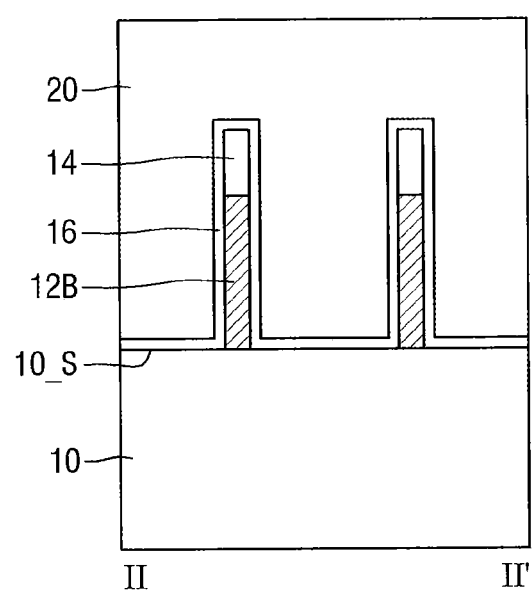
Figure 5C:
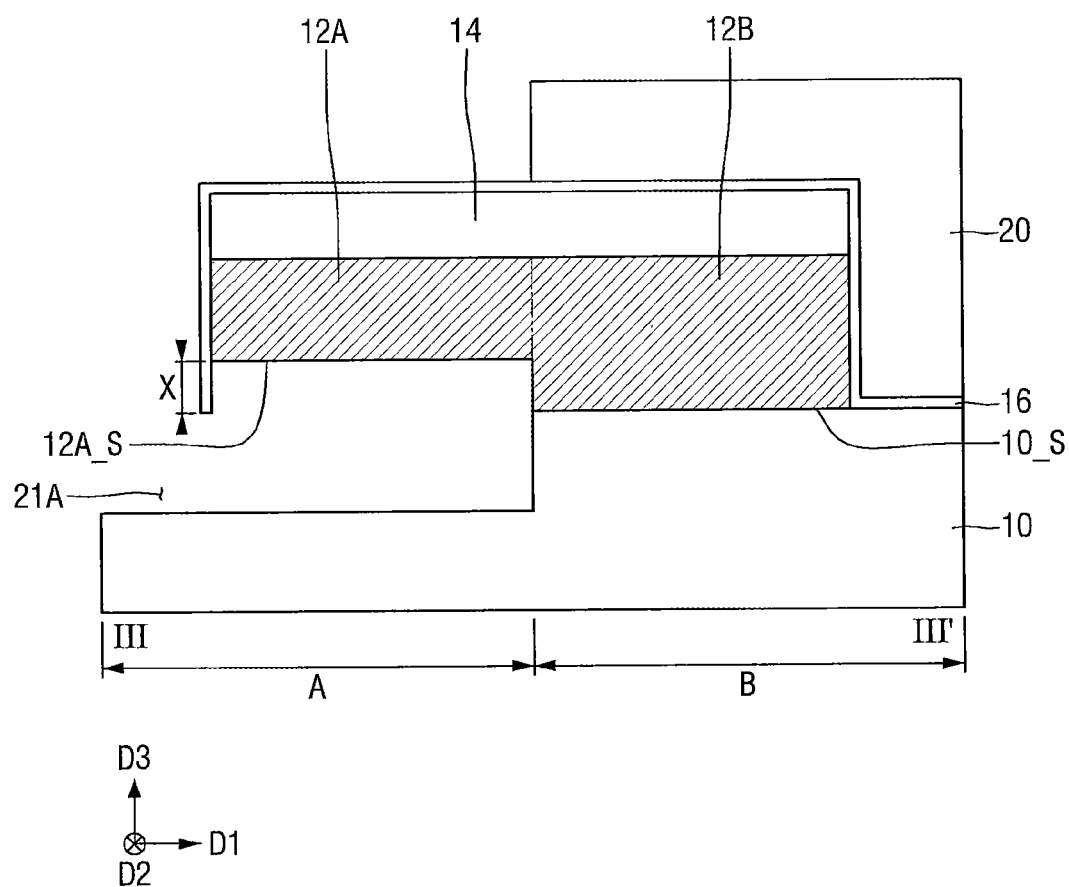

FIGS. 5A, 5B, and 5C are cross-sectional views taken, respectively, along the line I-I', the line II-II', and the line III-II' of FIG. 3 according to some embodiments of the inventive concept. Referring to FIGS. 5A, 5B, and 5C, while forming the first cavity 21A by removing the portion of the substrate 10, a lower portion of the first channel region 12A may be removed, and the lower surface 12A_S of the first channel region 12A may be at a level higher than the upper surface 10_S of the substrate 10 by a first distance X in the third direction D3. The first distance X is a distance between the lower surface 12A_S of the first channel region 12A and the upper surface 10_S of the substrate 10 in the third direction D3.

Figure 6:
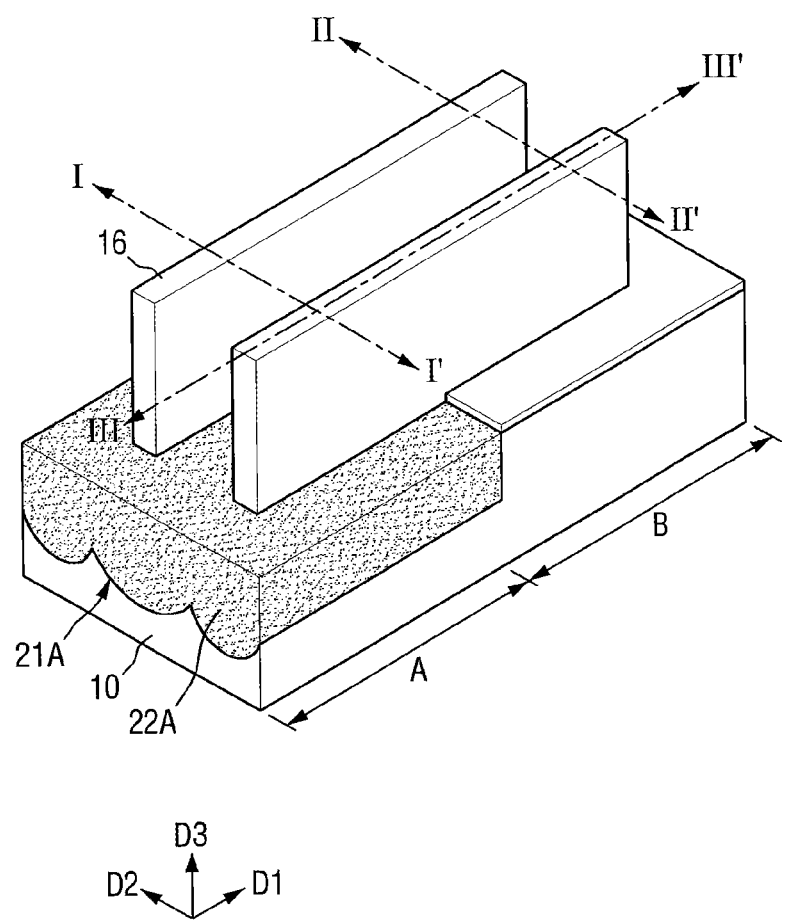

Referring to FIG. 6, a first bottom source/drain 22A may be formed in the first cavity 21A. In some embodiments, the first bottom source/drain 22A may be formed by performing an epitaxial growth process using an exposed surface of the substrate 10, which defines a surface of the first cavity 21A, as a seed layer. It will be understood that a relatively large area of the surface of the first cavity 21A may allow growing an epitaxial layer having fewer defects that are associated with an epitaxial growth process.

It will be also understood that forming the first cavity 21A exposing an entirety of the lower surface 12A_S of the first channel region 12A allows that the entirety of the lower surface 12A_S of the first channel region 12A overlaps the first bottom source/drain 22A and thereby form an abrupt junction between the first channel region 12A and the first bottom source/drain 22A.

In some embodiments, two first channel regions 12A may overlap a single first bottom source/drain 22A, as illustrated in FIG. 6, and the single first bottom source/drain 22A can be referred to as a merged first bottom source/drain 22A. An entirety of a lower surface of each of the two first channel regions 12A may overlap the merged first bottom source/drain 22A, and, in some embodiments, the entirety of the lower surface of each of the two first channel regions 12A may contact the merged first bottom source/drain 22A.

Figure 7A:
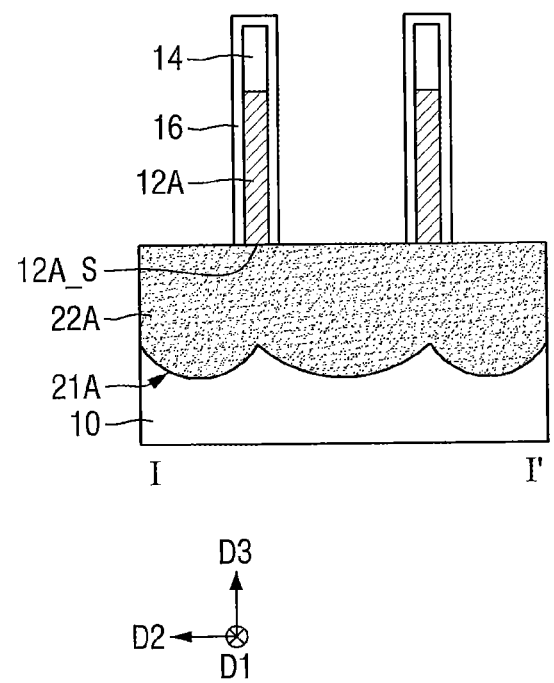
Figure 7B:
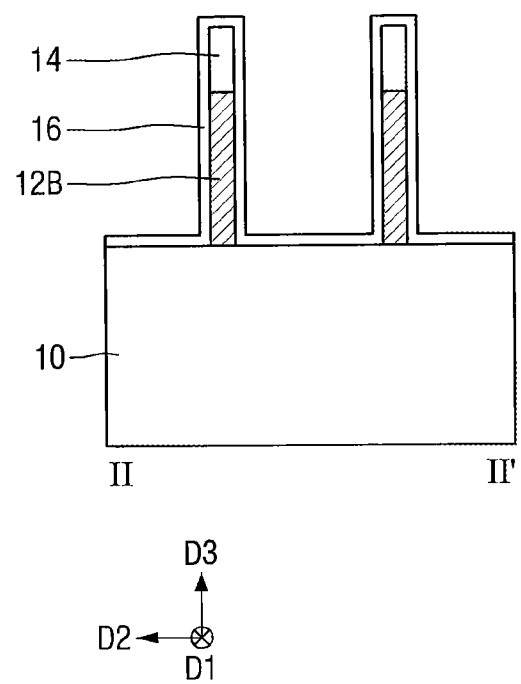
Figure 7C:
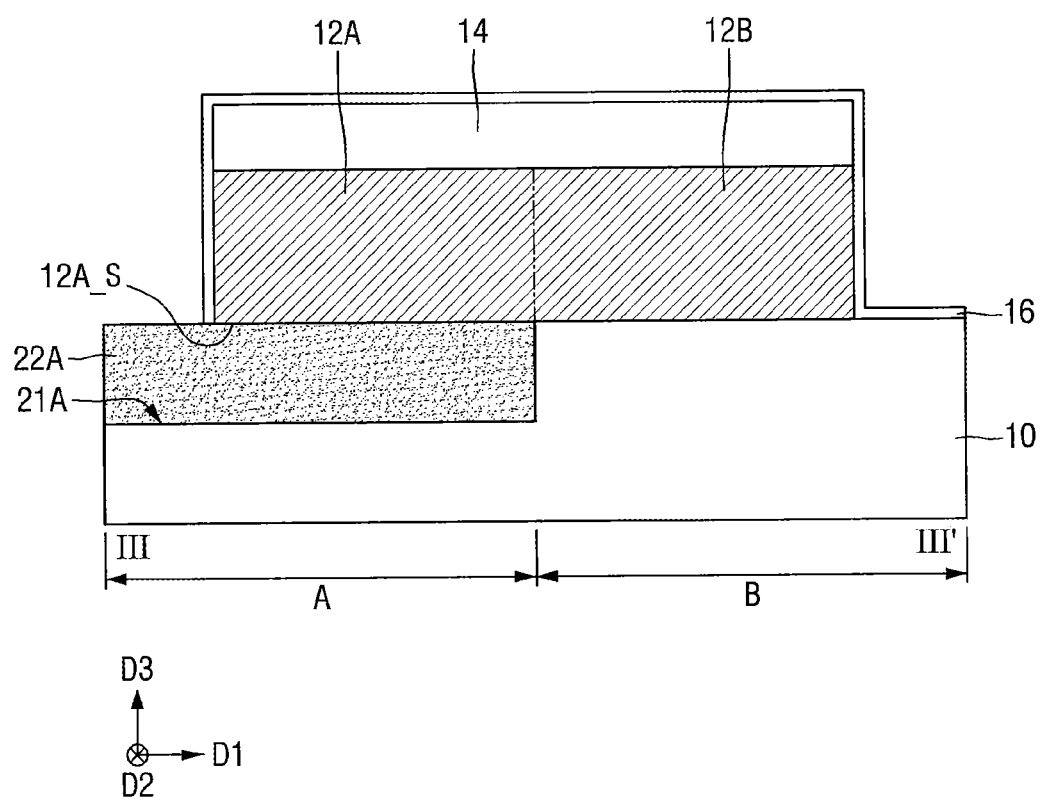

FIGS. 7A, 7B, and 7C are cross-sectional views taken, respectively, along the line I-I', the line II-II', and the line III-III' of FIG. 6 according to some embodiments of the inventive concept. Referring to FIGS. 7A, 7B, and 7C, the lower surface 12A_S of the first channel region 12A may directly contact the first bottom source/drain 22A. In some embodiments, an entirety of the lower surface 12A_S of the first channel region 12A may directly contact the first bottom source/drain 22A. Further, in some embodiments, an entirety of the lower surface 12A_S of the first channel region 12A may overlap the first bottom source/drain 22A as illustrated in FIGS. 7A and 7C. In some embodiments, the first bottom source/drain 22A may include a portion having a unitary structure (e.g., a structure that is free of an interface therein), and the entirety of the lower surface 12A_S of the first channel region 12A may overlap the portion having a unitary structure.

In some embodiments, the first bottom source/drain 22A may be a bottom source/drain of an N-type field-effect transistor, and the first bottom source/drain 22A may include, for example, a silicon layer. In some embodiments, the first bottom source/drain 22A (e.g., a silicon layer) may include phosphorous (P) as dopants.

Figure 8A:
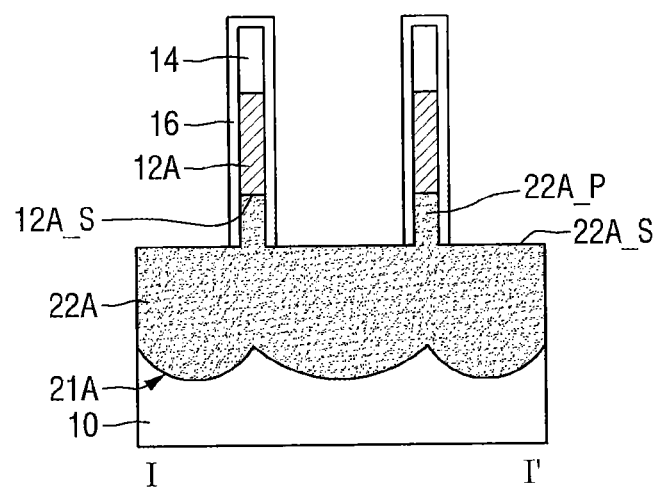
Figure 8A:
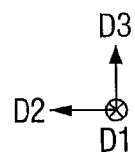
Figure 8B:
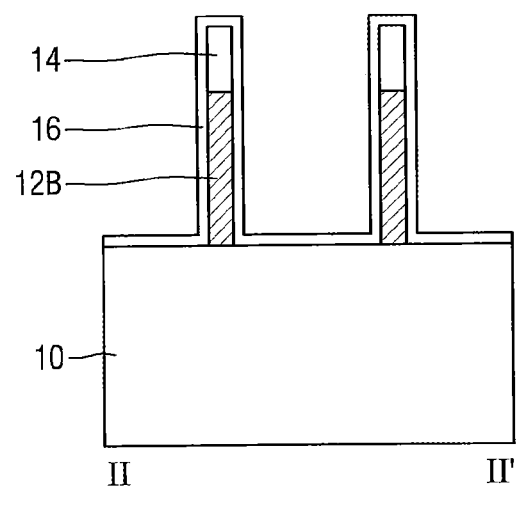
Figure 8B:
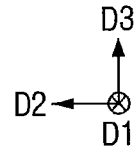
Figure 8C:
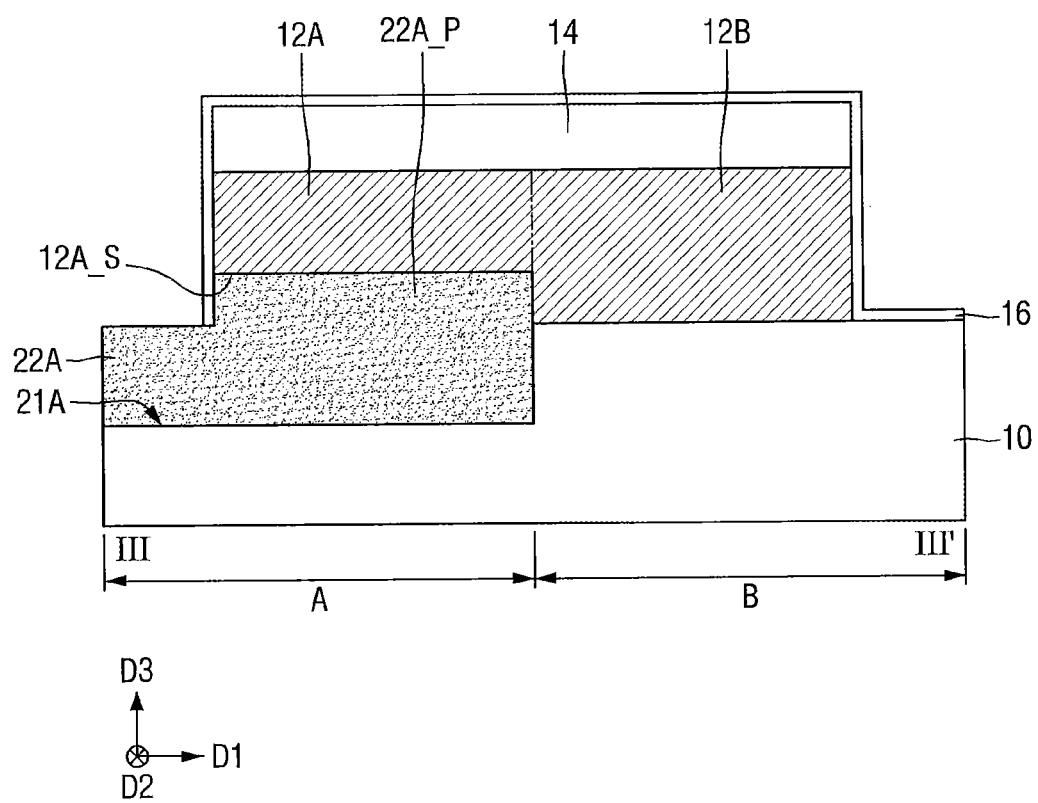

FIGS. 8A, 8B, and 8C are cross-sectional views taken, respectively, along the line I-I', the line II-II', and the line III-III' of FIG. 6 according to some embodiments of the inventive concept. Referring to FIGS. 8A, 8B, and 8C, the first bottom source/drain 22A may include a first protruding portion 22A_P that protrudes from an upper surface 22A_S of the first bottom source/drain 22A toward the first channel region 12A. The first protruding portion 22A_P may directly contact the lower surface 12A_S of the first channel region 12A.

In some embodiments, the first cavity 21A and the first bottom source/drain 22A may be formed in-situ (e.g., formed in a single process chamber.) For example, the first cavity 21A and the first bottom source/drain 22A may be formed in a process chamber for an epitaxial growth process. The first cavity 21A may be formed by an etching process using HCl as an etching gas and $H_2$ gas as a carrier gas. For example, HCl gas may be supplied at a flow rate of about 100 sccm (standard cubic centimeters per minute) to about 300 sccm, $H_2$ gas may be supplied at a flow rate of about 20,000 sccm to 30,000 sccm, and a process temperature may be in a range of about 700° C. to about 850° C. In some embodiments, the process temperature may be in a range of about 700° C. to about 770° C.

In some embodiments, the first cavity 21A may be formed by a two-step process in a process chamber for an epitaxial growth process. During the first step of the two-step process, $GeH_4$ gas may be supplied in addition to HCl gas and $H_2$ gas to form a thin SiGe layer (e.g., about 10 nm) on the substrate 10. For example, a flow rate of $GeH_4$ gas may be in a range of about 5 sccm to 20 sccm, and the first step may be performed for about 30 seconds to 60 seconds. During the second step of the two-step process, HCl gas and $H_2$ gas may be supplied without $GeH_4$ gas, and the second step may be performed for, for example, about 60 seconds to 120 seconds. After the first cavity 21A, the first bottom source/drain 22A may be formed in the process chamber by changing process gases and conditions (e.g. temperature, pressure).

Figure 9:
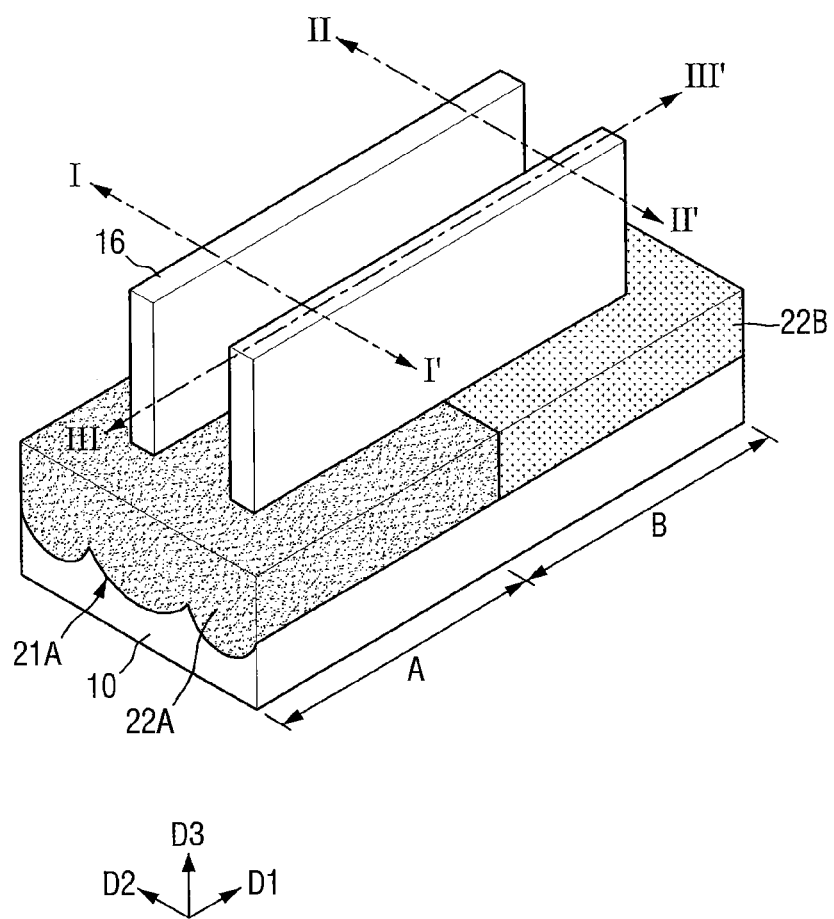

Referring to FIG. 9, processes similar to those discussed with reference to FIGS. 3 and 6 may be performed on the second region B of the substrate 10. A mask film may be formed on the first region A of the substrate 10 and a second cavity 21B may be formed in the second region B of the substrate 10 by removing a portion of the protecting layer 16 on the second region B of the substrate 10 and a portion of the second region B of the substrate 10. Subsequently, a second bottom source/drain 22B may be formed in the second cavity 21B. In some embodiments, the second bottom source/drain 22B may be formed only in the second region B of the substrate 10.

It will be understood that forming the second cavity 21B, which exposes an entirety of the lower surface 12B_S of the second channel region 12B, may allow that the entirety of the lower surface 12B_S of the second channel region 12B overlaps the second bottom source/drain 22B, and thus an abrupt junction between the second channel region 12B and the second bottom source/drain 22B may be formed.

In some embodiments, the second bottom source/drain 22B may be a bottom source/drain of a P-type field-effect transistor, and the second bottom source/drain 22B may include, for example, a silicon germanium layer. In some embodiments, the second bottom source/drain 22B (e.g., a silicon germanium layer) may include boron (B) as dopants.

Figure 10A:
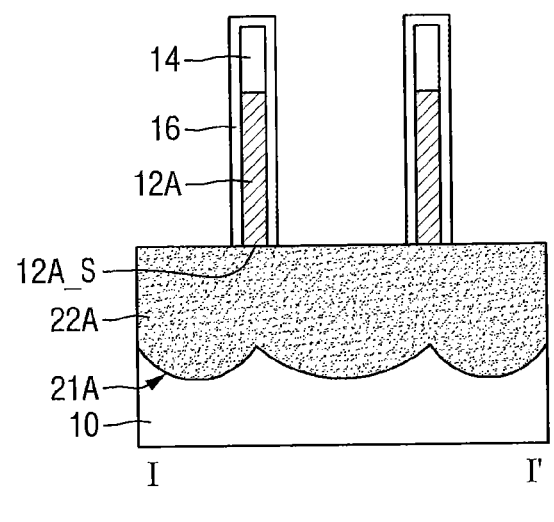
Figure 10A:
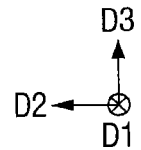
Figure 10B:
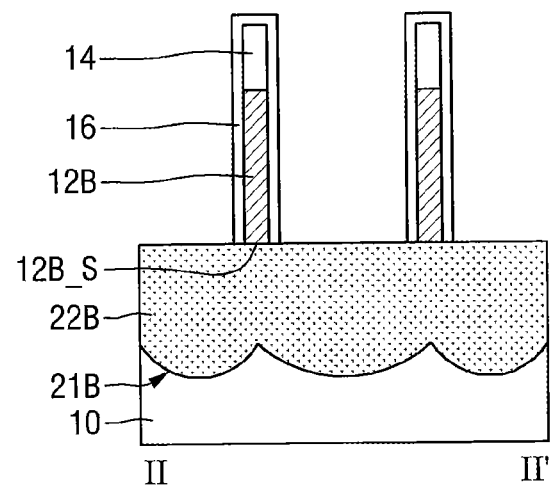
Figure 10B:
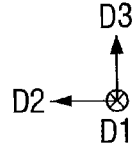
Figure 10C:
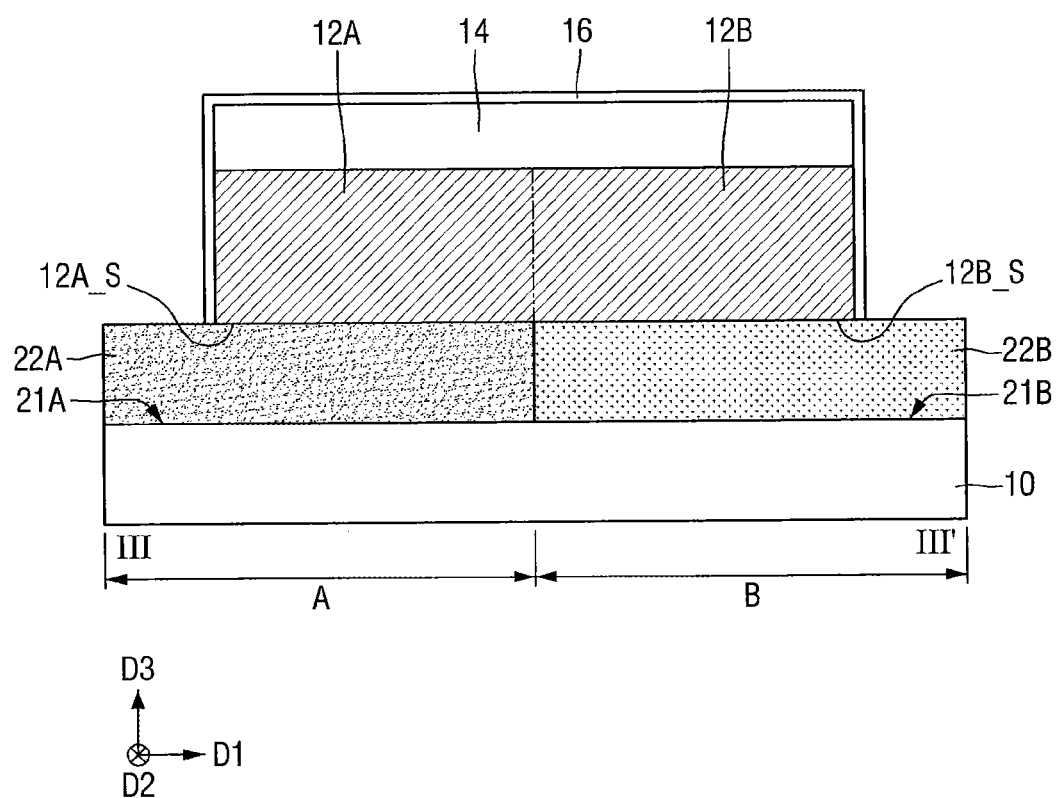

FIGS. 10A, 10B, and 10C are cross-sectional views taken, respectively, along the line I-I', the line II-II', and the line III-III' of FIG. 9 according to some embodiments of the inventive concept. Referring to FIGS. 10A, 10B, and 10C, the second cavity 21B is formed after the first bottom source/drain 22A is formed, and thus the first bottom source/drain 22A (e.g., a side of the first bottom source/drain 22A) may be partially removed while forming the second cavity 21B (i.e., while removing the portion of the second region B of the substrate 10). Therefore, a material included in the first bottom source/drain 22A may be selected to reduce or possibly prevent removing of the first bottom source/drain 22A while forming the second cavity 21B. For example, when the substrate 10 includes a silicon layer, it may be desirable to form the first bottom source/drain 22A including a silicon layer, rather than a silicon germanium layer, because a silicon germanium layer is easily removed while removing a portion of the silicon layer of the substrate 10.

In some embodiments, the lower surface 12B_S of the second channel region 12B may directly contact the second bottom source/drain 22B. In some embodiments, an entirety of the lower surface 12B_S of the second channel region 12B may directly contact the second bottom source/drain 22B as illustrated in FIGS. 10B and 10C. Further, in some embodiments, an entirety of the lower surface 12B_S of the second channel region 12B may overlap the second bottom source/drain 22B as illustrated in FIGS. 10B and 10C.

Figure 11A:
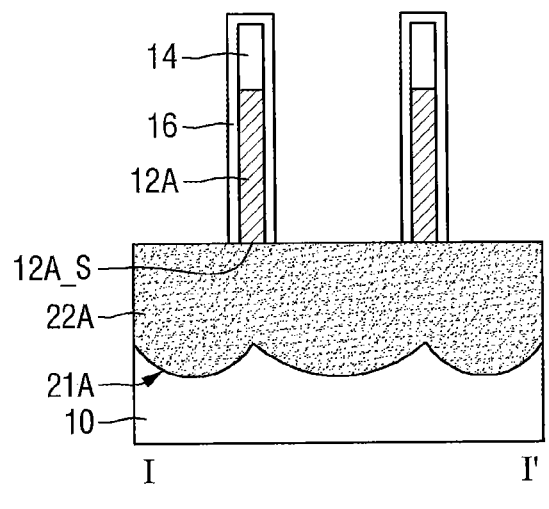
Figure 11A:
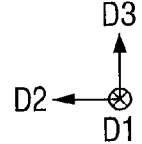
Figure 11B:
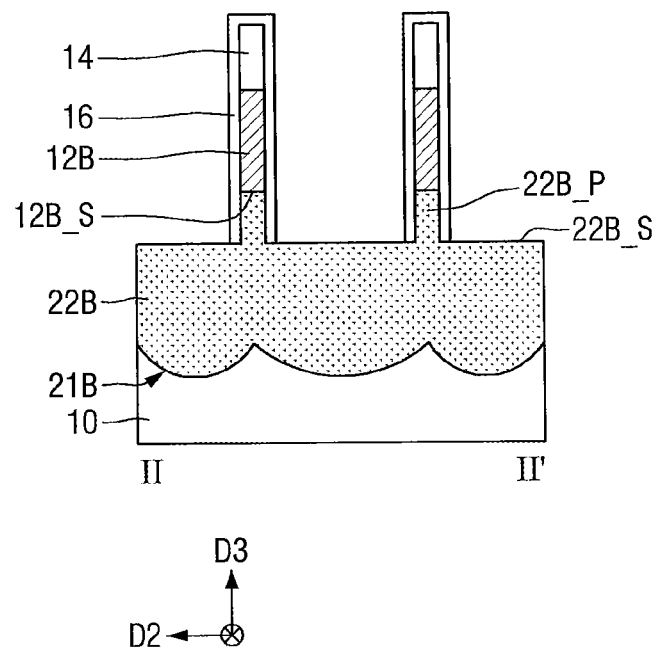
Figure 11C:
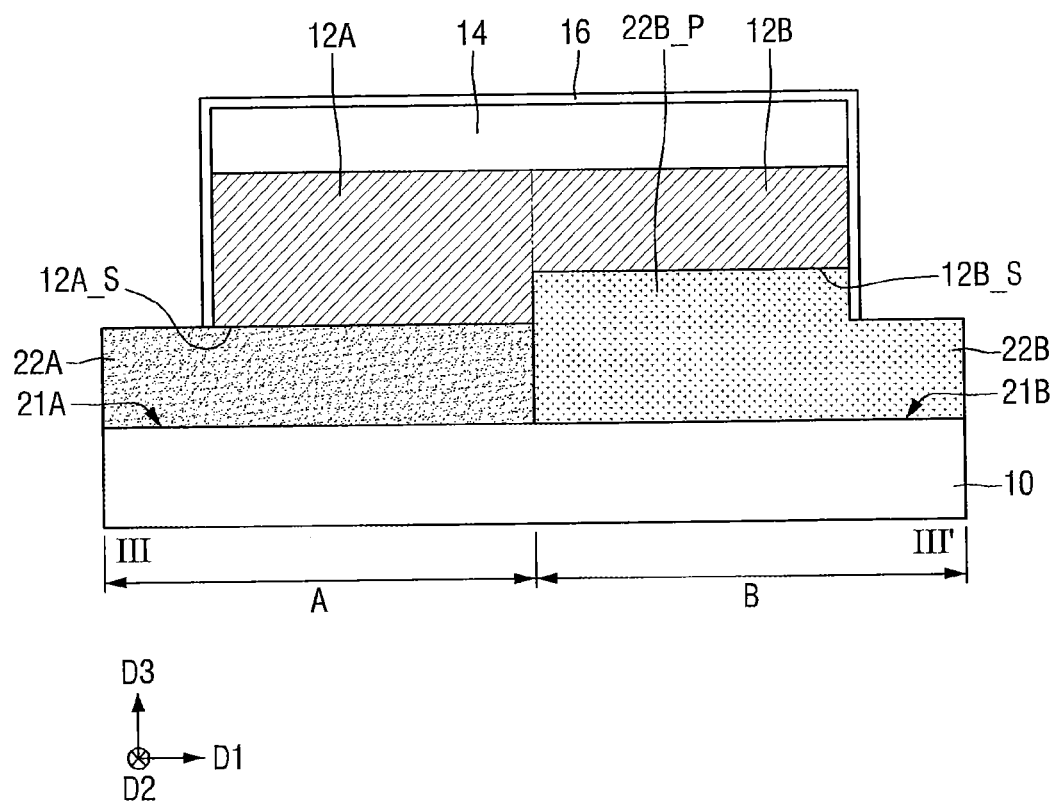

FIGS. 11A, 11B, and 11C are cross-sectional views taken, respectively, along the line I-I', the line II-II', and the line III-III' of FIG. 9 according to some embodiments of the inventive concept. Referring to FIGS. 11A, 11B, and 11C, the second bottom source/drain 22B may include a second protruding portion 22B_P that protrudes from an upper surface 22B_S of the second bottom source/drain 22B toward the second channel region 12B. The second protruding portion 22B_P may directly contact the lower surface 12B_S of the second channel region 12B.

Figure 12:
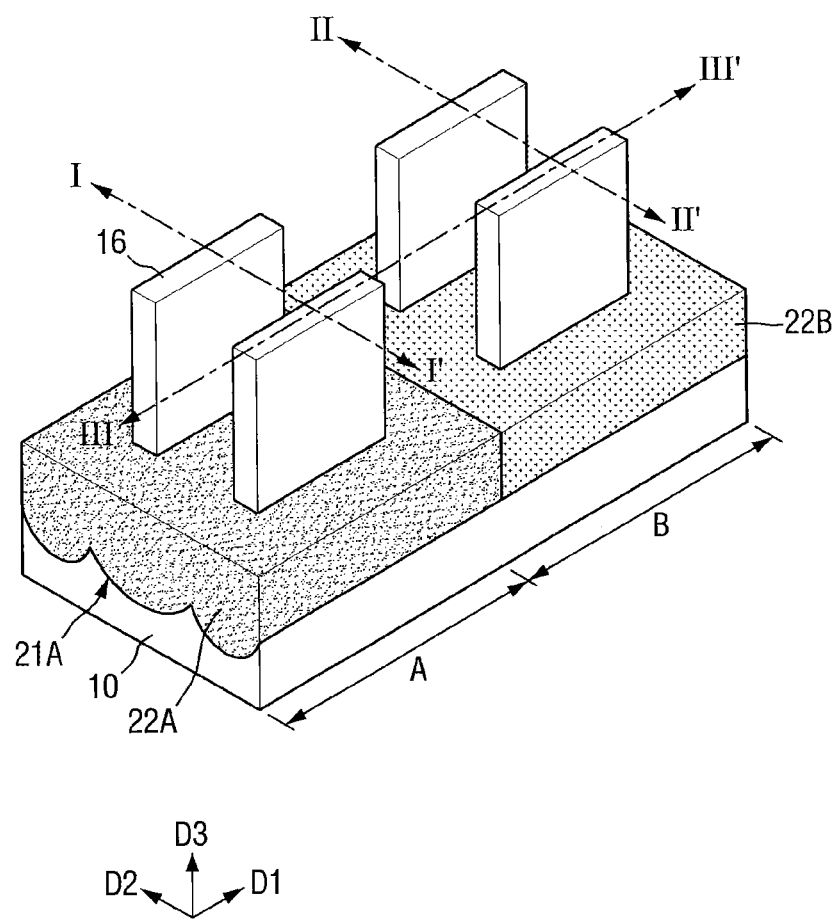
Figure 13A:
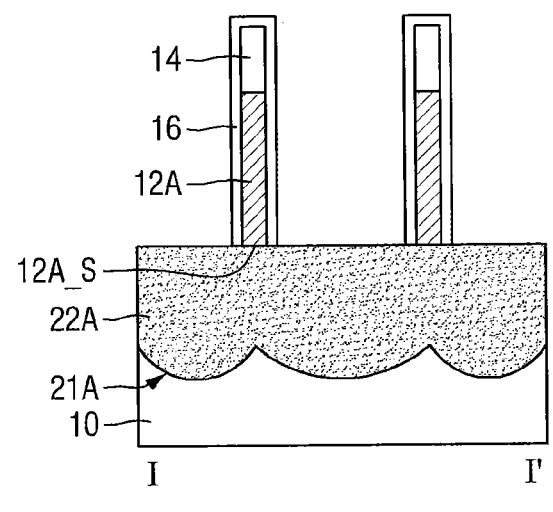
Figure 13A:
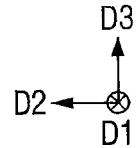
Figure 13B:
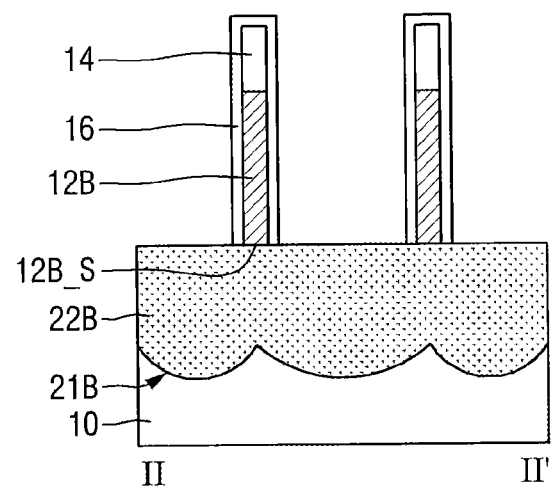
Figure 13C:
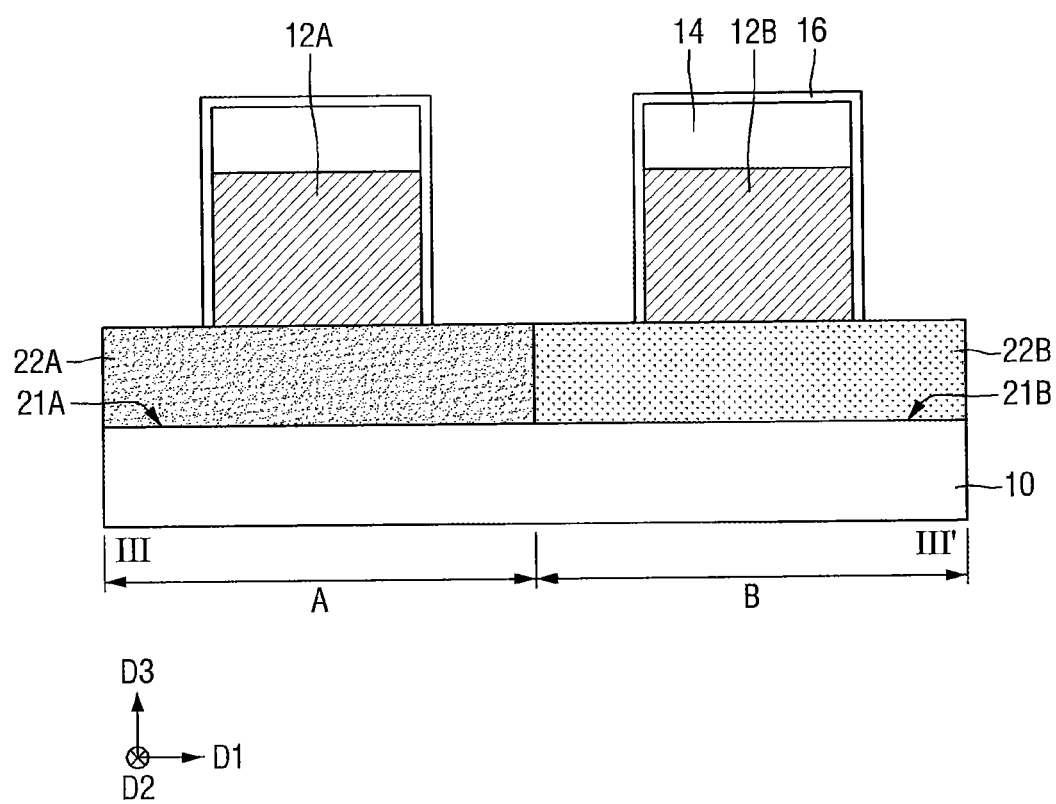

Referring to FIGS. 12 through 13C, a portion of the channel region 12 may be removed to separate the first channel region 12A and the second channel region 12B from each other. The portion of the channel region 12 may be removed until the first bottom source/drain 22A and the second bottom source/drain 22B are exposed.

Figure 14A:
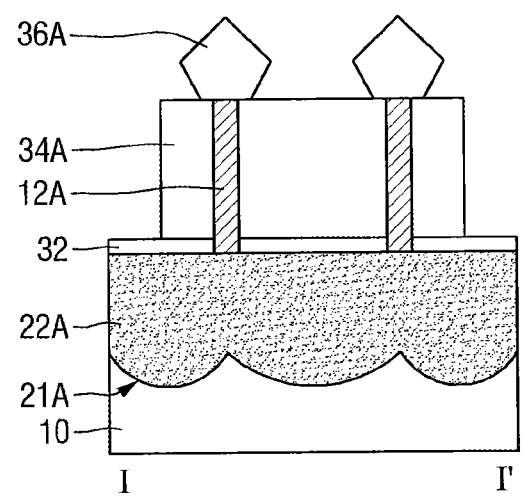
Figure 14A:
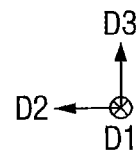
Figure 14B:
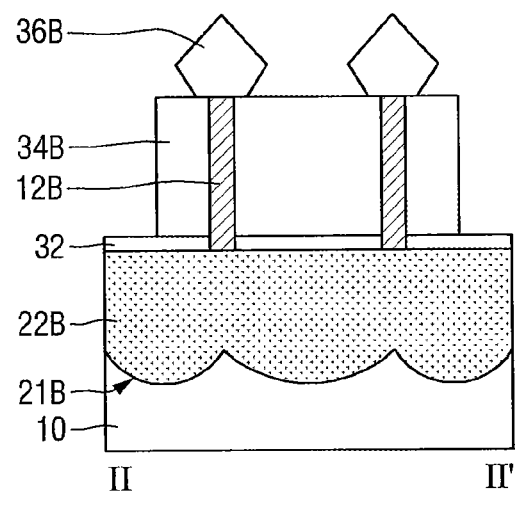
Figure 14B:
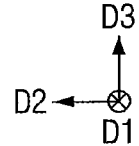
Figure 14C:
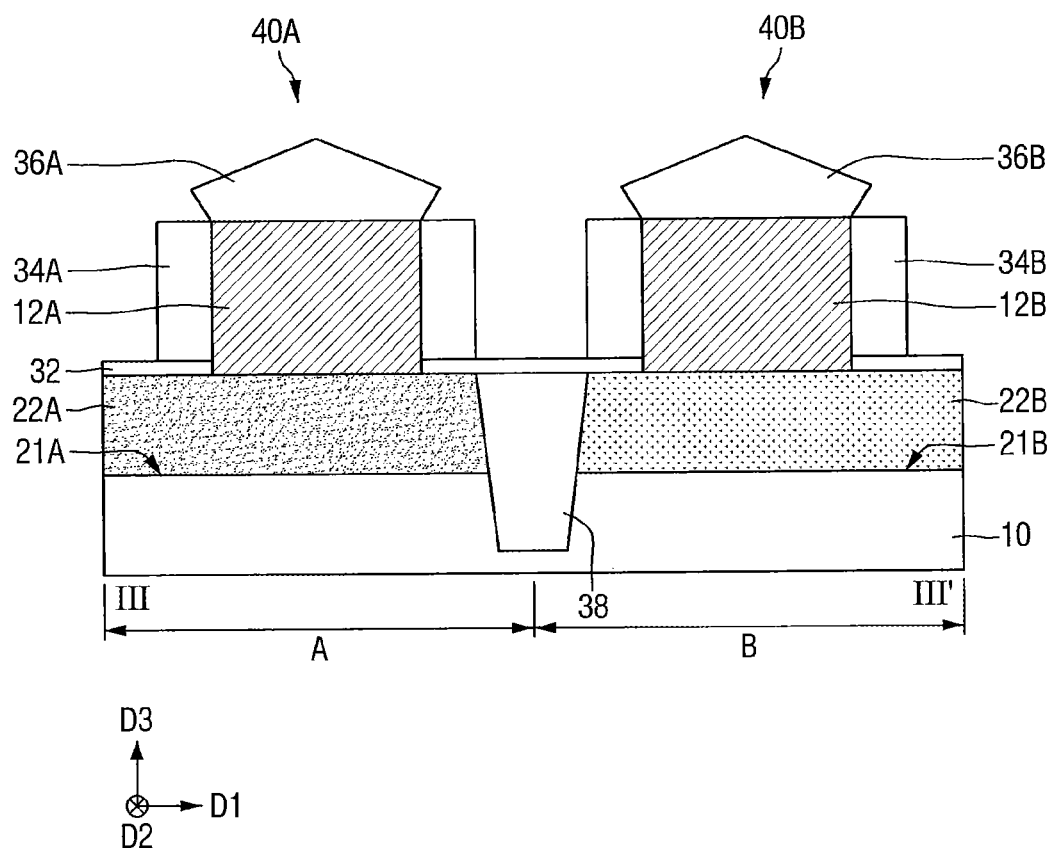

FIGS. 14A, 14B, and 14C are cross-sectional views corresponding to FIGS. 13A, 13B, and 13C after performing subsequent processes. Referring to FIGS. 14A, 14B, and 14C, the protecting layer 16 and mask layers 14 may be removed to expose the first channel region 12A and the second channel region 12B, and an isolation layer 38 may be formed between the first bottom source/drain 22A and the second bottom source/drain 22B to electrically isolate the first bottom source/drain 22A and the second bottom source/drain 22B. The isolation layer 38 may include, for example, silicon oxide, silicon nitride, and/or silicon oxynitride.

Further, an insulating layer 32 may be formed on the first bottom source/drain 22A and the second bottom source/drain 22B, and then a first gate structure 34A may be formed on a side of the first channel region 12A and a second gate structure 34B may be formed on a side of the second channel region 12B. The insulating layer 32 electrically isolates the first bottom source/drain 22A and the second bottom source/drain 22B from the first gate structure 34A and the second gate structure 34B, respectively. The insulating layer 32 may include silicon oxide, silicon nitride, and/or silicon oxynitride.

Each of the first gate structure 34A and the second gate structure 34B may include multiple layers that are sequentially stacked on the sides of the first channel region 12A and the second channel region 12B. The multiple layers of the first gate structure 34A and the second gate structure 34B may include a gate insulator, a work-function regulating layer, a diffusion barrier layer, an etch stop layer, and/or a conductive gate electrode.

Still referring to FIGS. 14A, 14B, and 14C, a first top source/drain 36A may be formed on the first channel region 12A, and a second top source/drain 36B may be formed on the second channel region 12B such that a first transistor 40A and a second transistor 40B may be formed on the first region A and the second region B of the substrate 10, respectively. In some embodiments, each of the first top source/drain 36A and the second top source/drain 36B may be formed by performing an epitaxial growth process using one of the first channel region 12A and the second channel region 12B as a seed layer. It will be understand that any of various methods can be used to form the first top source/drain 36A and the second top source/drain 36B.

Figure 15A:
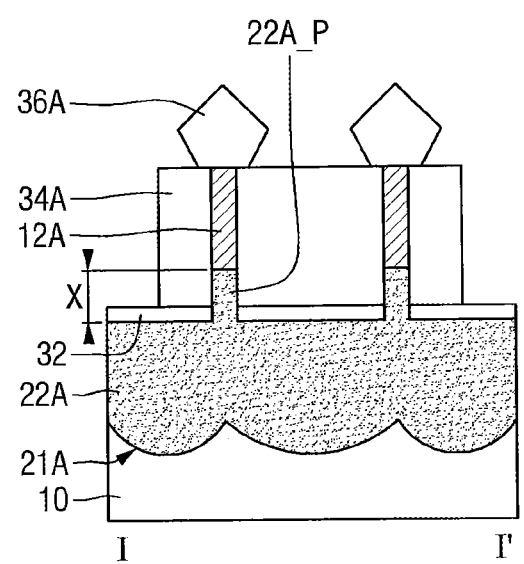
Figure 15A:
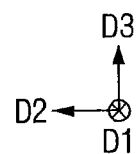
Figure 15B:
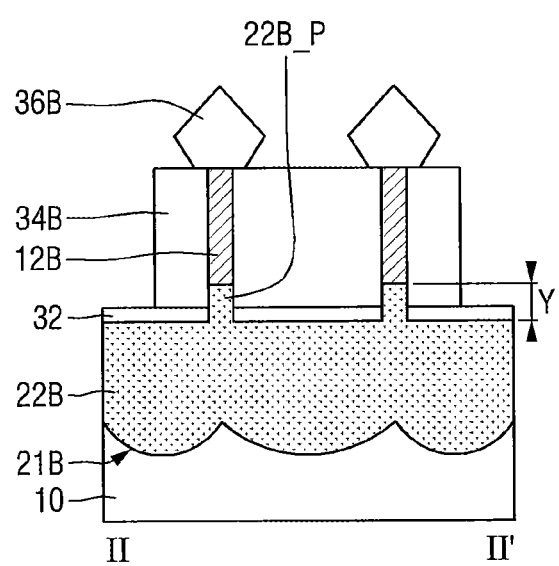
Figure 15C:
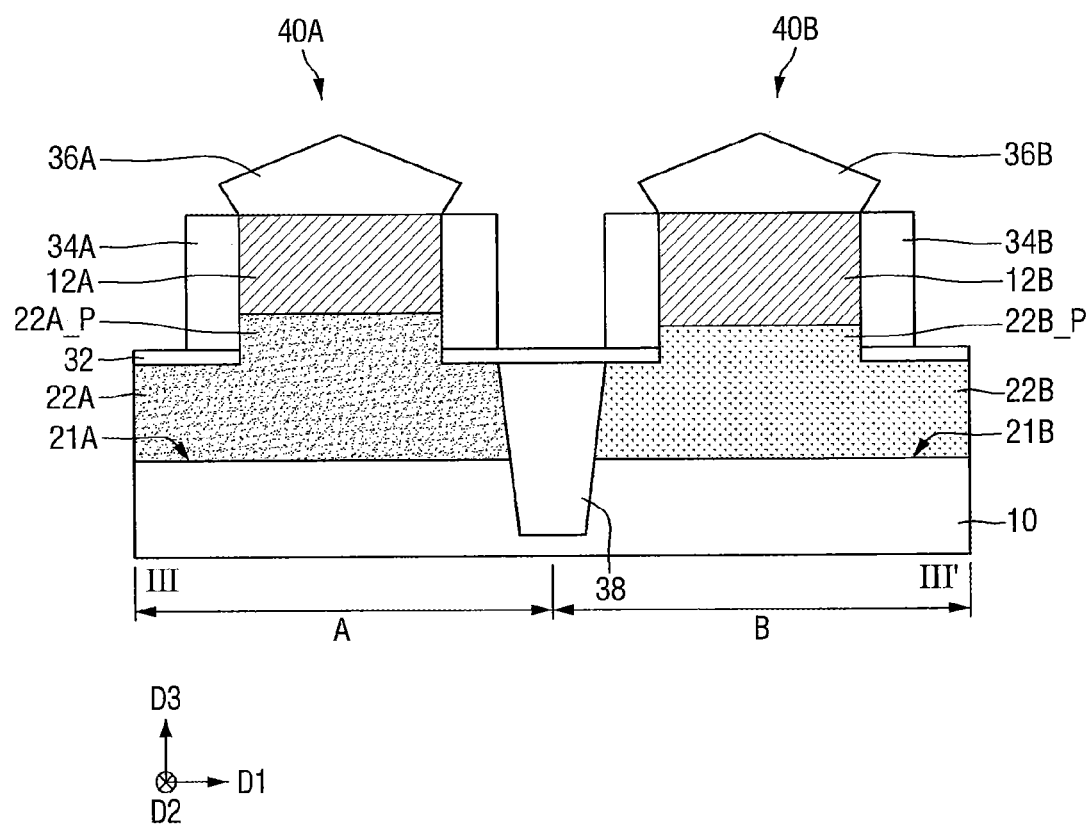

FIGS. 15A, 15B, and 15C are cross-sectional views corresponding to FIGS. 13A, 13B, and 13C after performing subsequent processes. Processes similar to those discussed with reference to FIGS. 14A, 14B, and 14C may be performed. The first bottom source/drain 22A may include a first protruding portion 22A_P that has a first thickness X in the third direction D3, and the second bottom source/drain 22B may include a second protruding portion 22B_P that has a second thickness Y in the third direction D3. For example, each of the first thickness X and the second thickness Y may be in a range of 0 nm to about 10 nm. In some embodiments, the first thickness X and the second thickness Y may be different as illustrated in FIGS. 15A and 15B. In some embodiments, at least one of the first thickness X and the second thickness Y may be non-zero (i.e., greater than zero). In some embodiments, the first thickness X and the second thickness Y may be the same.

According to the methods of forming a VFET device discussed herein, the first thickness X and the second thickness Y can have different values because the first cavity 21A and the second cavity 21B are formed by separate processes. For example, the first thickness X and the second thickness Y can be separately determined by controlling process conditions (e.g., etching time) for forming the first cavity 21A and the second cavity 21B. Therefore, it will be understood that bottom source/drain side junction overlap of the first transistor 40A and the second transistor 40B can be separately controlled by considering performances of the first transistor 40A and the second transistor 40B.

According to the methods of forming a VFET device discussed herein, entire lower surfaces 12A_S and 12B_S of the first channel region 12A and the second channel region 12B overlap the first bottom source/drain 22A and the second bottom source/drain 22B, respectively, and thus an abrupt junction between the first channel region 12A and the first bottom source/drain 22A and an abrupt junction between the second channel region 12B and the second bottom source/drain 22B can be formed.

Figure 16:
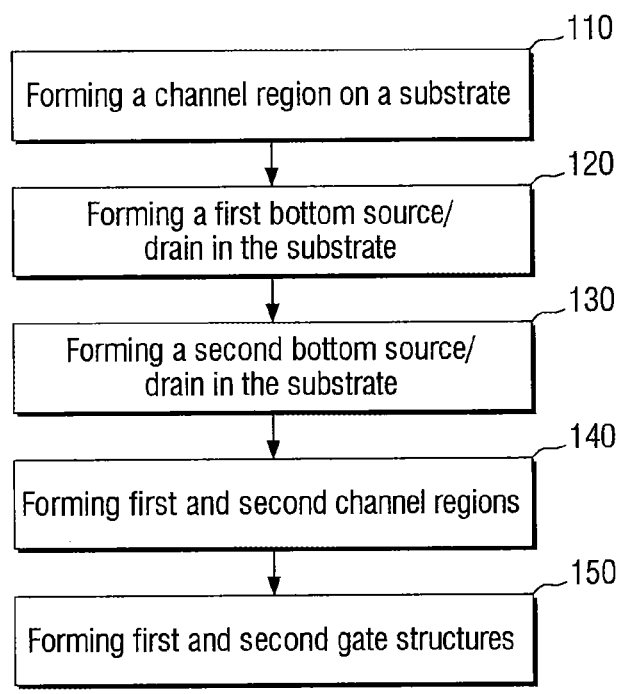
FIGS. 16 and 17 are flowcharts illustrating methods of forming a VFET device according to some embodiments of the inventive concept.

Referring to FIG. 16, the methods according to some embodiments of the inventive concept may include: forming a channel region 12 on a substrate 10 (Block 110) (See e.g., FIG. 1); forming a first bottom source/drain 22A in the substrate 10 (Block 120) (See e.g., FIGS. 3 through 8C); forming a second bottom source/drain 22B in the substrate 10 (Block 130) (See e.g., FIGS. 9 through 11C); forming first and second channel regions 12A and 12B (Block 140) (See e.g., FIGS. 12 through 13C); and forming first and second gate structures 34A and 34B (Block 150) (See e.g., FIGS. 14A through 15C).

Figure 17:
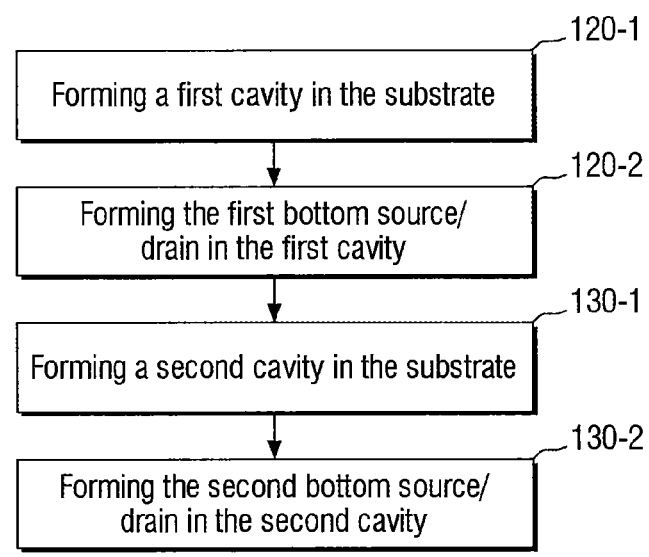

Referring to FIG. 17, in some embodiments, forming the first bottom source/drain 22A in the substrate 10 may include forming a first cavity 21A in the substrate 10 (Block 120-1) (See e.g., FIGS. 2 through 5C) and forming the first bottom source/drain 22A in the first cavity 21A (Block 120-2) (See e.g., FIGS. 6 through 8C). In some embodiments, forming the second bottom source/drain 22B in the substrate 10 may include forming a second cavity 21B in the substrate 10 (Block 130-1) and forming the second bottom source/drain 22B in the second cavity 21B (Block 130-2) (See e.g., FIGS. 9 through 11C).

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof.

It will be understood that references herein to "an element A vertically overlapping an element B" (or similar language) means that a vertical line intersecting both the elements A and B exists.

It will be understood that although the terms first, second, etc. may be used herein to describe various elements, these elements should not be limited by these terms. These terms are only used to distinguish one element from another. Thus, a first element could be termed a second element without departing from the teachings of the present inventive concept.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present inventive concept.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
a substrate including a first region and a second region;
a first bottom source/drain on the first region of the substrate;
a second bottom source/drain on the second region of the substrate;
a first gate on the first bottom source/drain;
a second gate on the second bottom source/drain;
a first channel on the first bottom source/drain and contacting the first gate;
a second channel on the second bottom source/drain and contacting the second gate;
a first top source/drain on the first channel; and
a second top source/drain on the second channel,
wherein the first bottom source/drain and the first top source/drain are spaced from each other in a vertical direction,
the first bottom source/drain comprises a first protruding portion that protrudes from an upper surface of the first bottom source/drain in the vertical direction and contacts the first channel, and the second bottom source/drain comprises a second protruding portion that protrudes from an upper surface of the second bottom source/drain in the vertical direction and contacts the second channel, and
the first protruding portion has a first thickness in the vertical direction, the second protruding portion has a second thickness in the vertical direction, and the first thickness is different from the second thickness.

2. The semiconductor device of claim 1, wherein an upper surface of the first region of the substrate includes a plurality of protrusions.

3. The semiconductor device of claim 1, wherein the first top source/drain and the second top source/drain have polygonal shapes.

4. The semiconductor device of claim 1, further comprising an insulating layer on the first bottom source/drain and the second bottom source/drain,
wherein the first gate and the second gate are on the insulating layer.

5. The semiconductor device of claim 4, further comprising an isolation layer separating the first bottom source/drain from the second bottom source/drain,
wherein the insulating layer contacts an upper surface of the isolation layer.

6. The semiconductor device of claim 1, further comprising an isolation layer between the first bottom source/drain and the second bottom source/drain.

7. The semiconductor device of claim 6, wherein the isolation layer contacts the first bottom source/drain from the second bottom source/drain, and
an upper surface of the isolation layer is coplanar with the upper surface of the first bottom source/drain and the upper surface of the second bottom source/drain.

8. The semiconductor device of claim 1, wherein each of the first channel and the second channel extends in a first direction, and
the first channel and the second channel are spaced apart from each other in the first direction.

9. The semiconductor device of claim 1, wherein the first bottom source/drain and the second bottom source/drain have different conductivity types.

10. A semiconductor device comprising:
a substrate including a first region and a second region;
a first bottom source/drain on the first region of the substrate;
a second bottom source/drain on the second region of the substrate;
a first gate on the first bottom source/drain;
a second gate on the second bottom source/drain;
a first channel on the first bottom source/drain and contacting the first gate;
a second channel on the second bottom source/drain and contacting the second gate;
a first top source/drain on the first channel;
a second top source/drain on the second channel; and
an insulating layer between the first bottom source/drain and the first gate and between the second bottom source/drain and the second gate,
wherein the first bottom source/drain comprises a first protruding portion that protrudes from an upper surface of the first bottom source/drain toward the first channel, and the second bottom source/drain comprises a second protruding portion that protrudes from an upper surface of the second bottom source/drain toward the second channel, and the insulating layer extends on and contacts the upper surface of the first bottom source/drain and the upper surface of the second bottom source/drain.

11. The semiconductor device of claim 10, wherein an upper surface of the first region of the substrate comprises a portion that contacts the first bottom source/drain and includes a recess.

12. The semiconductor device of claim 10, wherein the first top source/drain has a polygonal shape.

13. The semiconductor device of claim 10, wherein the first bottom source/drain and the second bottom source/drain have different conductivity types.

14. The semiconductor device of claim 10, further comprising an isolation layer separating the first bottom source/drain from the second bottom source/drain, wherein an upper surface of the isolation layer is coplanar with the upper surface of the first bottom source/drain and the upper surface of the second bottom source/drain.

15. The semiconductor device of claim 10, further comprising an isolation layer separating the first bottom source/drain from the second bottom source/drain, wherein the insulating layer contacts an upper surface of the isolation layer.

16. A semiconductor device comprising:
a substrate including a first region and a second region;
a first bottom source/drain on the first region of the substrate;
a second bottom source/drain on the second region of the substrate;
a first gate on the first bottom source/drain;
a second gate on the second bottom source/drain;
a first channel on the first bottom source/drain and contacting the first gate;
a second channel on the second bottom source/drain and contacting the second gate;
a first top source/drain on the first channel;
a second top source/drain on the second channel;
an isolation layer between the first bottom source/drain and the second bottom source/drain; and
an insulating layer extending between the first bottom source/drain and the first gate and between the second bottom source/drain and the second gate,
wherein the insulating layer extends on and contacts an upper surface of the isolation layer, and
the first top source/drain has a polygonal shape.

17. The semiconductor device of claim 16, wherein the insulating layer contacts an upper surface of the first bottom source/drain and an upper surface of the second bottom source/drain.

18. The semiconductor device of claim 17, wherein the upper surfaces of the isolation layer, the first bottom source/drain and the second bottom source/drain are coplanar with each other.

19. The semiconductor device of claim 16, wherein the first bottom source/drain includes a first protruding portion that protrudes from an upper surface of the first bottom source/drain and contacts a lower surface of the first channel.

20. The semiconductor device of claim 19, wherein the second bottom source/drain includes a second protruding portion that protrudes from an upper surface of the second bottom source/drain and contacts a lower surface of the second channel, the first bottom source/drain and the first top source/drain are spaced from each other in a vertical direction, and
the first protruding portion has a first thickness in the vertical direction, the second protruding portion has a second thickness in the vertical direction, and the first thickness is different from the second thickness.

* * * * *